US010334770B2

(12) United States Patent
Amano et al.

(10) Patent No.: US 10,334,770 B2
(45) Date of Patent: Jun. 25, 2019

(54) COMPONENT HOLDING STATE DETECTION METHOD AND COMPONENT MOUNTING MACHINE

(71) Applicant: FUJI CORPORATION, Chiryu-shi (JP)

(72) Inventors: Masafumi Amano, Okazaki (JP); Yusuke Yamakage, Anjo (JP); Takeshi Fujishiro, Toyohashi (JP)

(73) Assignee: FUJI CORPORATION, Chiryu-shi (JP)

( * ) Notice: Subject to any disclaimer, the term of this patent is extended or adjusted under 35 U.S.C. 154(b) by 635 days.

(21) Appl. No.: 14/903,243

(22) PCT Filed: Jul. 8, 2013

(86) PCT No.: PCT/JP2013/068672
§ 371 (c)(1),
(2) Date: Jan. 6, 2016

(87) PCT Pub. No.: WO2015/004717
PCT Pub. Date: Jan. 15, 2015

(65) Prior Publication Data
US 2016/0150689 A1 May 26, 2016

(51) Int. Cl.
*H05K 13/08* (2006.01)
*H04N 5/225* (2006.01)
*H04N 5/357* (2011.01)

(52) U.S. Cl.
CPC ........... *H05K 13/08* (2013.01); *H04N 5/2253* (2013.01); *H04N 5/2254* (2013.01); *H04N 5/357* (2013.01);
(Continued)

(58) Field of Classification Search
CPC ............... H05K 13/08; H05K 13/0413; H05K 13/0818; H05K 13/0812
See application file for complete search history.

(56) References Cited

FOREIGN PATENT DOCUMENTS

EP          2200418 A2 *  6/2010  ............. H05K 13/04
JP       2003-249797 A    9/2003
(Continued)

OTHER PUBLICATIONS

Extended European Search Report dated Jun. 24, 2016 in Patent Application No. 13889316.9.
(Continued)

*Primary Examiner* — Livus Radu Cazan
(74) *Attorney, Agent, or Firm* — Oblon, McClelland, Maier & Neustadt, L.L.P.

(57) ABSTRACT

A component mounting machine includes a part camera in which a suction nozzle for sucking a component P and a fiducial mark are provided on a head, a sub-lens is installed in a visual field of a lens, the component is imaged through a main lens, and it is possible to image the fiducial mark through the lens and the sub-lens. Distortion correction values of the main lens portion are measured, distortion correction values of the sub-lens portion are measured, and the distortion correction values are stored in advance as a distortion correction table. During component mounting, when the component P which is sucked by the suction nozzle and the fiducial mark are imaged at the same time by the part camera, the obtained image is corrected using the distortion correction table, and a suction state of the component P is detected based on the corrected image.

5 Claims, 11 Drawing Sheets

(52) U.S. Cl.
CPC ..... *H05K 13/0812* (2018.08); *H05K 13/0818* (2018.08)

(56) References Cited

FOREIGN PATENT DOCUMENTS

| | | | |
|---|---|---|---|
| JP | 2005-011950 | | 1/2005 |
| JP | 2005-197564 A | | 7/2005 |
| JP | 2005197564 A | * | 7/2005 |
| JP | 2007-012889 | | 1/2007 |
| JP | 2010-147401 A | | 7/2010 |

OTHER PUBLICATIONS

International Search Report dated Aug. 20, 2013 for PCT/JP2013/068672 filed on Jul. 8, 2013.
Japanese Office Action dated Jun. 6, 2017 in Patent Application No. 2015-526035 (with English translation).

* cited by examiner

COMPONENT HOLDING STATE DETECTION METHOD AND COMPONENT MOUNTING MACHINE

TECHNICAL FIELD

The present invention disclosure relates to a component holding state detection method which detects a holding state of a component held by a holding member and relates to a component mounting machine which mounts a component on a board.

BACKGROUND ART

In the related art, a device which images an electronic component (a component) sucked by a suction nozzle using a camera and recognizes a suction position of the component based on the image which is obtained by the imaging is proposed as this type of component mounting machine (for example, refer to PTL 1). In this component mounting machine, before the recognition of the suction position of the component, a glass jig which is marked with a plurality of dots is sucked by the suction nozzle, the glass jig sucked by the suction nozzle is imaged using the camera, the dot positions in the image which is obtained by the imaging are obtained, and a transformation between machine coordinates and camera coordinates is obtained based on the obtained dot position information. When the suction position of the component is recognized, a positional shift is corrected by transforming the recognized suction position of the component from the camera coordinates to the machine coordinates using the obtained transformation.

There is proposed a technique in which fiducial marks are provided on a head on which the suction nozzle is mounted and, by imaging simultaneously the component sucked by the suction nozzle with the fiducial marks, the suction position of the component is recognized, using the fiducial marks as a reference (for example, refer to PTL 2).

PTL 1: JP-A-2007-12889
PTL 2: JP-A-2005-11950

SUMMARY OF INVENTION

In a case of imaging a component sucked by the suction nozzle attached to the head and imaging the fiducial marks which are provided on the head at the same time, when the fiducial marks are provided at a different height from the component sucked by the suction nozzle, it is not possible to focus on the fiducial marks using a lens (a first lens) which is installed so as to focus on the component sucked by the suction nozzle. In this case, it is possible to conceive of a device in which a lens (a second lens) with a smaller diameter than the first lens is installed in the visual field of the first lens in order to focus on the fiducial marks, the component sucked by the suction nozzle is imaged through the first lens, and the fiducial marks are imaged through the first lens and the second lens. However, when a plurality of lenses are combined, combined distortion arises due to the different distortion characteristics of each of the lenses, and the captured image of the fiducial marks which are imaged through the first lens and the second lens are distorted in a complex manner. Therefore, in the method of the related art, a case arises in which it is not possible to accurately recognize the positions of both the component and the fiducial marks from the image in which the component and the fiducial marks are imaged at the same time.

A main object of a component holding state detection method and a component mounting machine of the present disclosure is, in a device which images a component held in a holding member attached to a head and images a fiducial mark which is provided on the head at the same time, to enable more accurate recognition of the positions of both the component and the fiducial mark by further improving accuracy in distortion correction of the captured image.

The component holding state detection method and the component mounting machine of the present disclosure adopt the following means for achieving the main object described above.

According to the present disclosure, there is provided a component holding state detection method in which an imaging means is configured to have a first imaging region in which an object forms an image on an image sensor through a first lens and a second imaging region in which an object forms an image on the image sensor through the first lens and a second lens, a component is held using a holding member attached to a head, the component held by the holding member is imaged in the first imaging region and a fiducial mark which is provided on the head is imaged in the second imaging region such that the component and the fiducial marks are imaged at the same time, and a holding state of the component held by the holding member is detected based on an image which is obtained by the imaging, the method comprising: before determining the holding state, imaging a distortion measurement object in the first imaging region, measuring and storing a distortion value of the first imaging region based on an image which is obtained by the imaging, imaging a distortion measurement object in the second imaging region, and measuring and storing a distortion value of the second imaging region based on an image which is obtained by the imaging; when the component is held by the holding member, imaging the component and the fiducial mark by the imaging means, correcting an image obtained by the imaging of the component in the first imaging region, based on the stored distortion value of the first imaging region, and correcting an image obtained by the imaging of the fiducial mark in the second imaging region, based on the stored distortion value of the second imaging region; and detecting the holding state of the component held by the holding member based on the corrected image.

In this component holding state detection method of the present disclosure, before determining the holding state, the distortion measurement object is imaged in the first imaging region in which the object is imaged through the first lens, and the distortion value of the first imaging region is measured and stored based on the image which is obtained through the imaging. The distortion measurement object is imaged in the second imaging region in which the object is imaged through the first lens and the second lens, and the distortion value of the second imaging region is measured and stored based on the image which is obtained through the imaging. When the component is held by the holding member, the component and the fiducial mark are imaged at the same time by the imaging means, and the image which is obtained by imaging the component in the first imaging region is corrected based on the stored distortion value of the first imaging region. The image which is obtained by imaging the fiducial mark in the second imaging region is corrected based on the stored distortion value of the second imaging region. By measuring, in advance, the distortion values using the images of the distortion measurement object which is imaged in each of the first imaging region in which the object is imaged through the first lens and the second imaging region in which the object is imaged through the first lens and the second lens, it is possible to appropriately correct the image which is imaged in the first imaging region and the image which is imaged in the second imaging region using the corresponding distortion value. As a result, it is possible to obtain a corrected image in which the distortion is effectively suppressed, and by detecting the holding state of the component held by the holding member based on the corrected captured image, it is possible to more accurately determine the holding state of the component. Note that, the imaging of the distortion measurement object in the first imaging region and the imaging of the distortion measurement object in the second imaging region may be performed at the same time and may be performed separately.

In this component holding state detection method of the present disclosure, the method may include, before the holding state is determined, installing a first distortion measurement object as the distortion measurement object, imaging the first distortion measurement object in the first imaging region, measuring and storing the distortion value of the first imaging region based on an image which is obtained by the imaging, installing a second distortion measurement object which differs from the first distortion measurement object as the distortion measurement object, imaging the second distortion measurement object in the second imaging region, and measuring and storing the distortion value of the second imaging region based on an image which is obtained through the imaging. In this case, since it is possible to use an appropriate distortion measurement object according to the lens, it is possible to more accurately measure the distortion value.

In the component holding state detection method of the present disclosure of this aspect, the method may includes, configuring the first distortion measurement object with a pattern in which a plurality of features are arranged in a matrix, and configuring the second distortion measurement object with a pattern in which a plurality of features are arranged in a matrix at a different pitch from the first distortion measurement object.

According to the present disclosure, there is provided a component mounting machine which mounts a component on a board, the machine comprising: a head to which a holding member that holds the component is attached and which is provided with a fiducial marks; a movement means for moving the head; an imaging means which includes a first imaging region in which an object forms an image on an imaging element sensor through a first lens and a second imaging region in which an object forms an image on the imaging element sensor through the first lens and a second lens and is capable of imaging the component and the fiducial marks at the same time by imaging the component held by the holding member in the first imaging region and imaging the fiducial marks in the second imaging region; a holding state detection means for correcting an image which is obtained throughby the imaging in the first imaging region based on a first distortion value which is measured in advance in relation to the first imaging region, correcting an image which is obtained throughby the imaging in the second imaging region based on a second distortion value which is measured in advance in relation to the second imaging region, and detecting a holding state of the component held by the holding member based on the corrected image, when the component and the fiducial marks are imaged at the same time by the imaging means; and an mounting control means for controlling the movement means and the holding member such that the component is mounted on the board based on the determined holding state of the component.

In the component mounting machine of the present disclosure, the imaging means is configured to include the first imaging region in which the object image is formed on the image sensor through the first lens and the second imaging region in which the object image is formed on the image sensor through the first lens and the second lens, and, when the component is held by the holding member, the component held by the holding member is imaged in the first imaging region and the fiducial mark is imaged in the second imaging region at the same time. An image which is obtained by imaging the component in the first imaging region is corrected based on the first distortion value which is measured in advance in relation to the first imaging region, and an image which is obtained by imaging the fiducial mark in the second imaging region is corrected based on the second distortion value which is measured in advance in relation to the second imaging region. In this manner, since the image which is captured in the first imaging region in which the object is imaged through the first lens and the image which is captured in the second imaging region in which the object is imaged through the first lens and the second lens are corrected using the different distortion values, it is possible to obtain a corrected image in which the distortion is effectively suppressed. As a result, by detecting the holding state of the component based on the corrected image and performing control such that the component is mounted to the board based on the determination results of the detection, it is possible to more accurately mount the component on the board.

DESCRIPTION OF EMBODIMENTS

Figure 1:
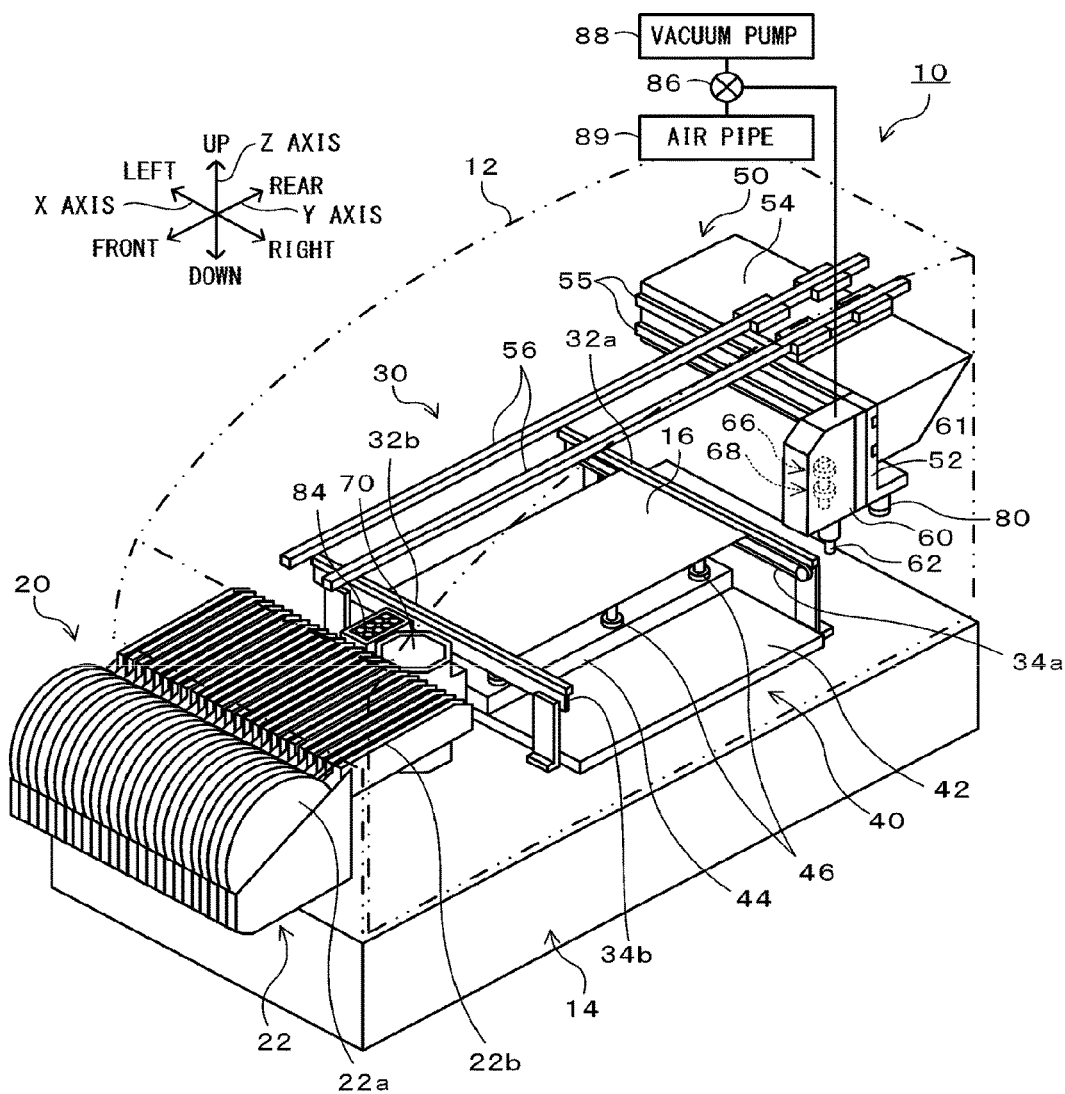
FIG. 1 is a configuration diagram schematically illustrating the configuration of a component mounting machine 10 as an example of the present disclosure.
Figure 2:
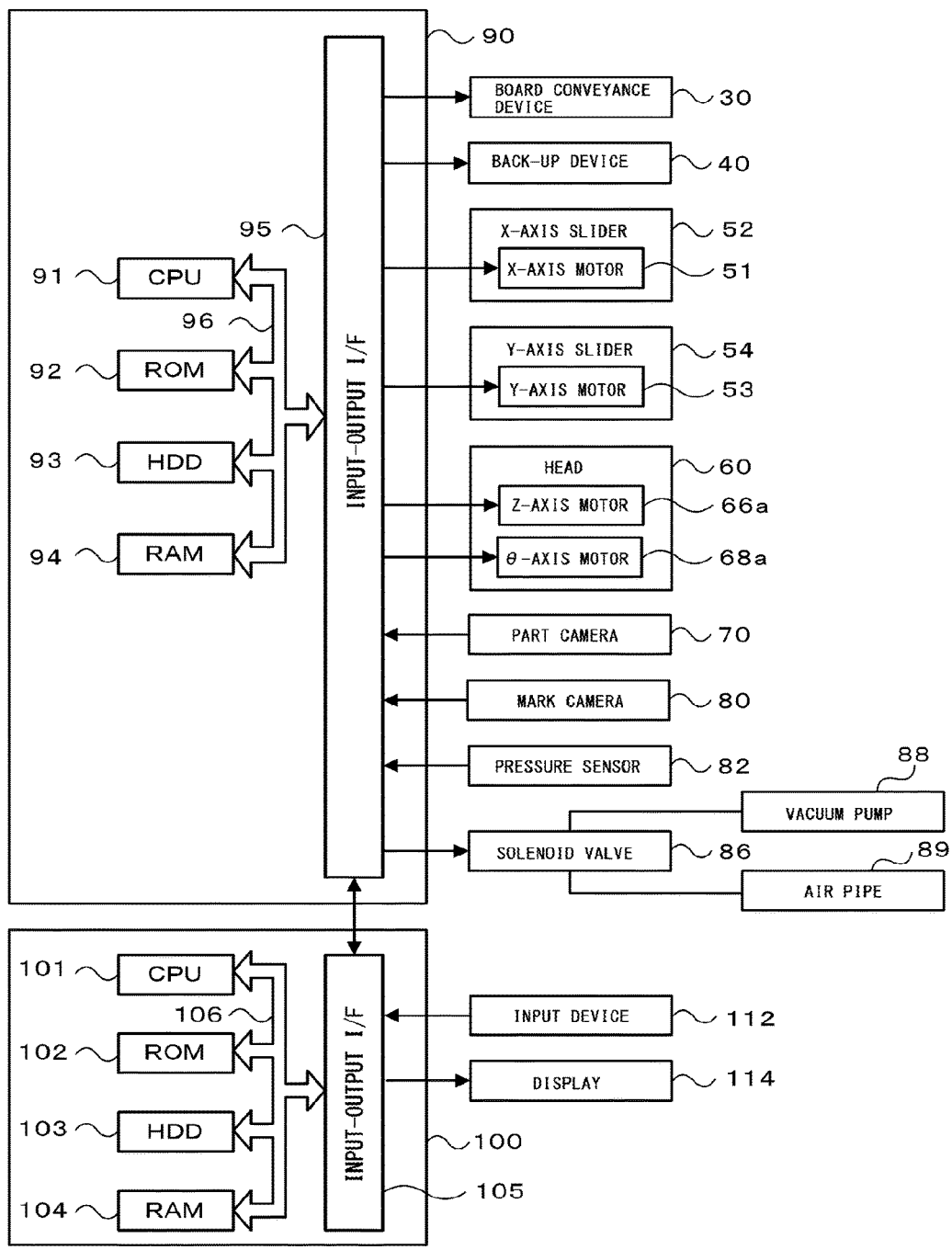
FIG. 2 is a block diagram illustrating electrical connection relationships of a control device 90.

Next, description will be given of a mode for carrying out the present disclosure using an example. FIG. 1 is a configuration diagram schematically illustrating the configuration of the component mounting machine 10 as an example of the present disclosure, and FIG. 2 is a block diagram illustrating the electrical connection relationships of the control device 90.

As illustrated in FIG. 1, the component mounting machine 10 is provided with a component supply device 20 which supplies electronic components (hereinafter simply referred to as "components"), a board conveyance device 30 which conveys a circuit board (hereinafter, referred to simply as a "board") 16, a back-up device 40 which backs up the board 16 which is conveyed, a component mounting device 50 which mounts the components which are supplied by the component supply device 20 onto the board 16 which is backed up by the back-up device 40, and the control device 90 (refer to FIG. 2) which controls the overall mounting machine, and, the board conveyance device 30, the back-up device 40, and the component mounting device 50 are stored in a housing 12. Note that, in FIG. 1, only the single component mounting machine 10 is depicted; however, in a component mounting line, a plurality of component mounting machines are provided to line up, and a management computer 100 (refer to FIG. 2) for managing these is connected to the control device of each of the component mounting machines.

As illustrated in FIG. 1, the component supply device 20 is provided with a tape feeder 22 attached in a detachable manner to the front side of the housing 12. The tape feeder 22 is provided with a reel 22a around which is wound a tape, and components are stuck to the surface of the tape at a predetermined interval. These components are protected by a film which covers the surface of the tape, and, when the tape is pulled out from the reel 22a, the film is peeled in a feeder section 22b, and the components are supplied in an exposed state.

As illustrated in FIG. 1, the board conveyance device 30 is provided with a pair of supporting plates 32a and 32b which are provided on a base 14 which is installed on the bottom level portion of the housing 12 so as to be separated by a predetermined interval in the Y-axis direction (the front-rear direction of FIG. 1), and a pair of conveyor belts 34a and 34b which are provided on the surfaces of the supporting plates 32a and 32b that face each other. The pair of supporting plates 32a and 32b are configured as long-shaped members where the longitudinal direction is the X-axis direction (the left-right direction in FIG. 1), and a driving wheel and a driven wheel are provided on each end in the longitudinal direction. The conveyor belts 34a and 34b bridge across the drive wheels and driven wheels which are provided on the supporting plates 32a and 32b, and convey the board 16 from the left to the right in FIG. 1 due to the drive wheels being driven by drive motors which are not depicted in the drawing.

As illustrated in FIG. 1, the back-up device 40 is provided with a back-up plate 42 which is provided to be capable of being lifted and lowered by a lifting and lowering device which is not depicted in the drawing, and a base plate 44 which is mounted on the top surface of the back-up plate 42. A plurality of back-up pins 46 for backing up the board 16 from the reverse side is provided to stand on the base plate 44.

As illustrated in FIG. 1, the component mounting device 50 is provided with an X-axis slider 52 which moves in the X-axis direction (the left-right direction in FIG. 1) due to the driving of an X-axis motor 51 (refer to FIG. 2), a Y-axis slider which moves in the Y-axis direction (the front-rear direction in FIG. 1) due to the driving of a Y-axis motor 53 (refer to FIG. 2), the head 60 attached to the X-axis slider 52, a suction nozzle 62 which is mounted to the head 60 so as to be capable of movement in the Z-axis direction and rotation around the Z axis and is capable of sucking a component, the part camera 70 which is provided on the base 14 and is for imaging the component sucked by the suction nozzle 62, a mark camera 80 attached to the X-axis slider 52 and is for imaging board positioning fiducial marks which are provided on the board 16, and a nozzle stocker 84 which stocks plural types of suction nozzle which can be mounted to the head 60.

The X-axis slider 52 is attached to guide rails 55 which are provided along the X-axis direction on the front surface of the Y-axis slider 54, and the X-axis slider 52 is capable of sliding in the X-axis direction while being guided by the guide rails 55. The Y-axis slider 54 is attached to guide rails 56 which are provided along the Y-axis direction on the top portion of the housing 12, and the Y-axis slider 54 is capable of sliding in the Y-axis direction while being guided by the guide rails 56.

Figure 3:
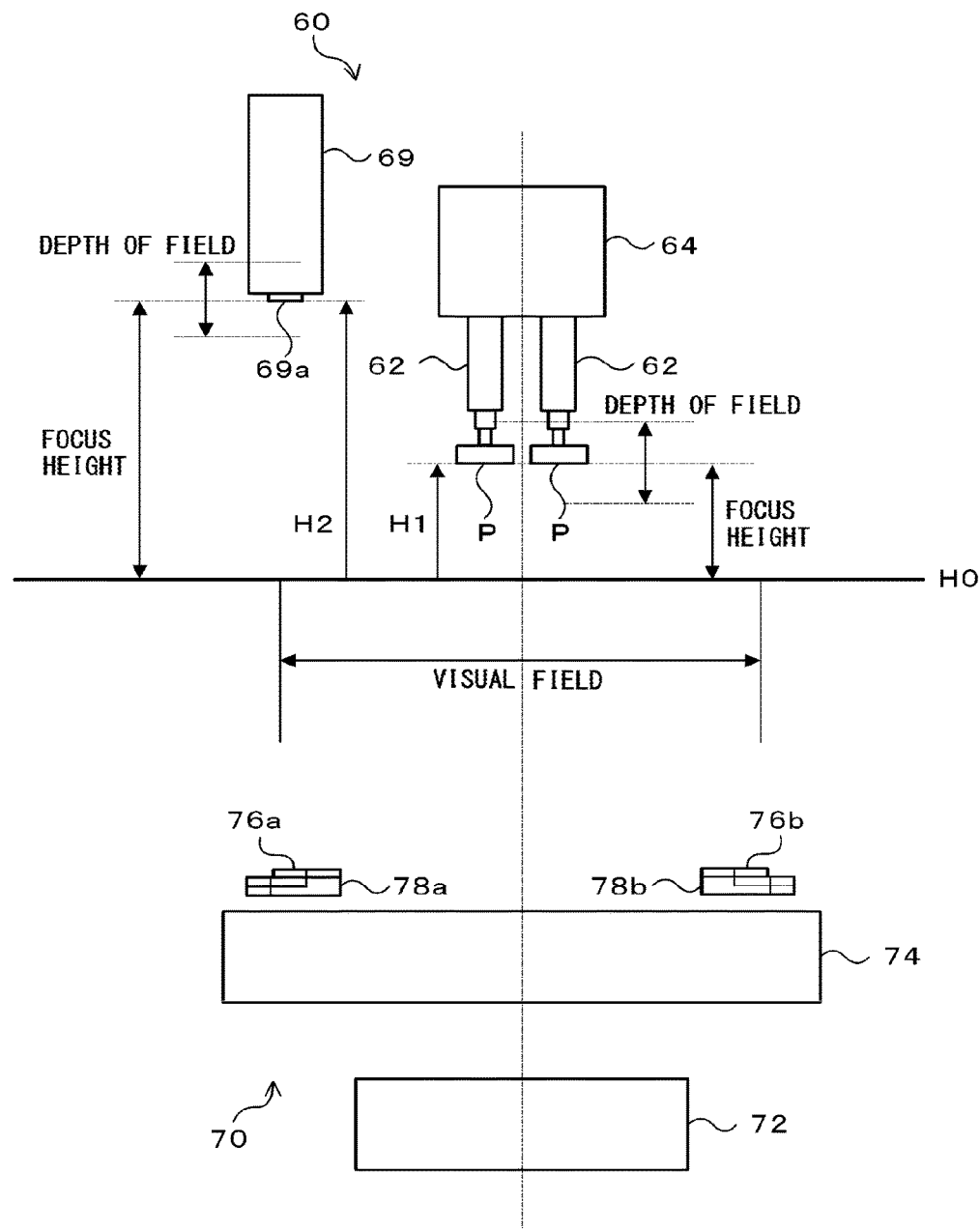
FIG. 3 is a schematic diagram of a head 60 and a part camera 70 as viewed from the side.

As illustrated in FIG. 3, the head 60 is provided with a nozzle holder 64 which is configured as a cylindrical member having an internal pathway which is not depicted in the drawing and holds the suction nozzle 62, a Z-axis actuator 66 which is configured as a linear feed screw mechanism having a screw shaft and a ball screw nut attached to the nozzle holder 64 and causes the nozzle holder 64 to move in the Z-axis direction due to the screw shaft being rotationally driven by a Z-axis motor 66a, and a θ-axis actuator 68 which includes a ball spline nut which is spline engaged to a shaft which is joined to the nozzle holder 64, for example, and causes the nozzle holder 64 to rotate around the Z-axis due to the ball spline nut being rotationally driven by a θ-axis motor 68a. The head 60 is configured to be capable of being attached to and detached from the X-axis slider 52, and it is possible to exchange the head 60 for one appropriate for the number and type of the suction nozzle 62 which is used.

The suction nozzle 62 is configured to be capable of being attached to and detached from the nozzle holder 64, and it is possible to exchange the suction nozzle 62 for one appropriate for the shape and size of the component to be sucked. The internal pathway (not depicted) of the suction nozzle 62 communicates with the internal pathway (not depicted) of the nozzle holder 64, and the internal pathway of the nozzle holder 64 selectively communicates with one of either a vacuum pump 88 or an air pipe 89 via a solenoid valve 86. Therefore, when the solenoid valve 86 is operated such that the internal pathway of the nozzle holder 64 communicates with the vacuum pump 88, a negative pressure acts on the suction nozzle 62 and it is possible to suck the component, and, when the solenoid valve 86 is operated such that the internal pathway of the nozzle holder 64 communicates with the air pipe 89, a positive pressure acts on the suction nozzle 62 and it is possible to release the suction of the component.

Figure 4:
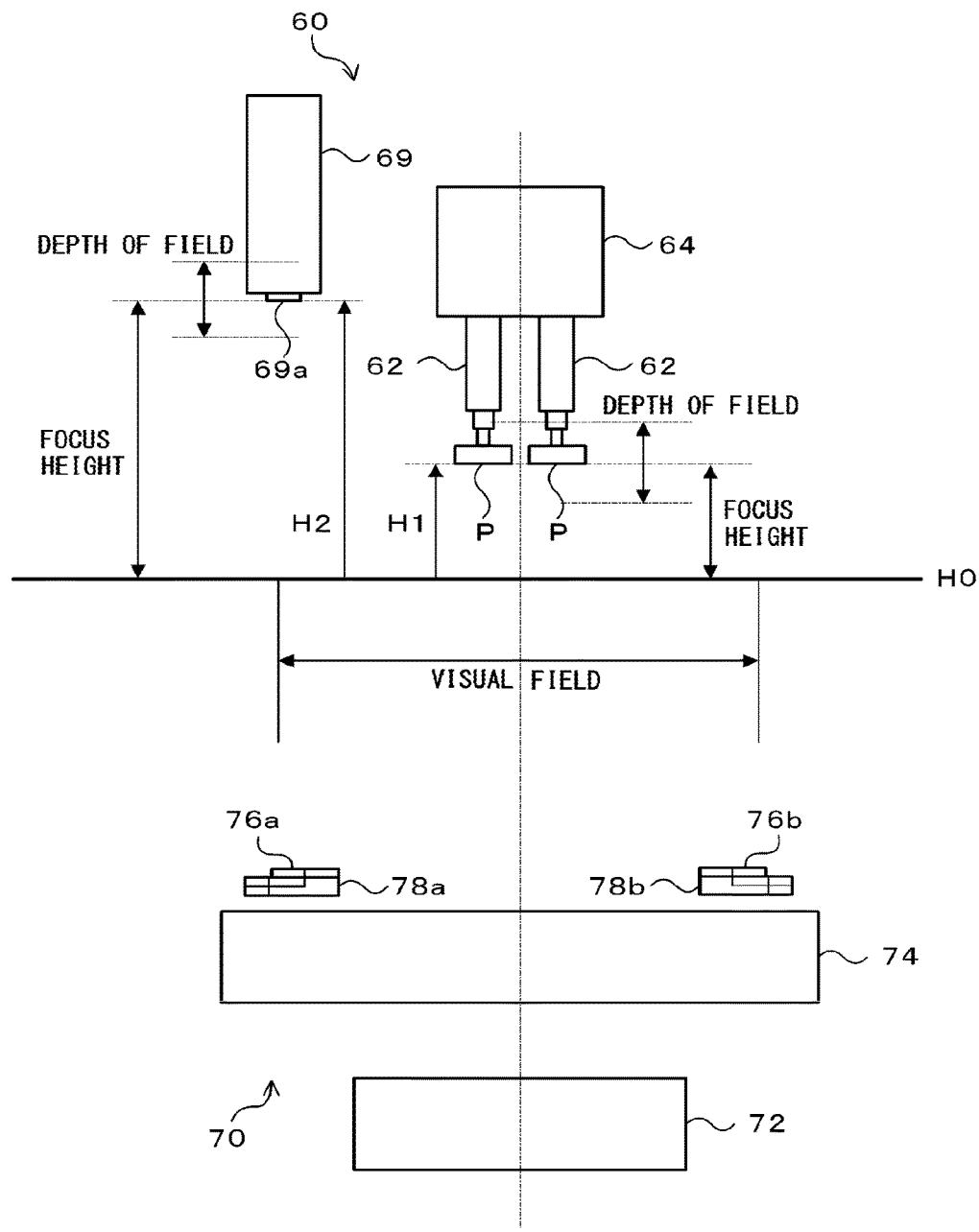
FIG. 4 is a plan view of the part camera 70 as viewed from above.

FIG. 3 is a schematic diagram of the head 60 and the part camera 70 as viewed from the side, and FIG. 4 is a plan view of the part camera 70 as viewed from above. As depicted in the drawings, a plurality of the suction nozzles 62 are mounted at an equal interval in the circumferential direction on the bottom end of the nozzle holder 64. Note that, in the example, although the number of the suction nozzles 62 which are mounted to the nozzle holder 64 is a plurality, the number may be one. A component P sucked by the suction nozzle 62 is maintained at a predetermined height H1 in relation to a height reference surface H0 of the part camera 70 above the part camera 70.

As illustrated in FIG. 3, a position reference section 69 which serves as a fiducial position when imaging the component P sucked by the suction nozzle 62 using the part camera 70 is provided on the head 60. In the example, four circular fiducial marks 69a are arranged on the bottom surface of the position reference section 69 in a square shape at the same pitch. Naturally, the shape, number, and arrangement layout of the fiducial marks 69a are not limited to the example, and it is possible to determine these freely. The fiducial marks 69a are arranged at a height H2 which is higher than the predetermined height H1 in relation to the height reference surface H0. Accordingly, when the head 60 moves over the board 16, the position reference section 69 does not interfere with the mounted components. Note that, the fiducial marks 69a are arranged in different positions and heights according to the type of the head 60 which is mounted.

The part camera 70 is arranged on the base 14 of the front side of the board conveyance device 30. The imaging range of the part camera 70 is above the part camera 70. When the suction nozzle 62 sucked by the component passes over the part camera 70, the part camera 70 images the state of the sucked component and outputs the image to the control device 90. The control device 90 determines whether the component is correctly sucked by comparing the image which is captured by the part camera 70 with an image of a correct suction state which is stored in advance.

As illustrated in FIG. 4, the part camera 70 is provided with an image sensor 72 having a square or rectangular imaging region 71 in which a plurality of light receiving elements is arranged two-dimensionally, the main lens 74 which is arranged to cover the entire range of the imaging region 71 of the image sensor 72, and sub-lenses 76a to 76d which are arranged above the main lens 74 separated by a predetermined interval so as to cover a portion of the imaging region 71 of the image sensor 72. Note that, it is possible to use a CCD (Charged Coupled Device), a CMOS (Complementary Metal Oxide Silicon), or the like as the image sensor 72, for example, and in the present example, the image sensor 72 is formed from 5120×5120 pixels. Naturally, the number of pixels of the image sensor 72 may be any number.

The main lens 74 is formed of a well-known condensing lens, and the focus height is set to substantially match the height H1 of the component P sucked by the suction nozzle 62. Note that, the main lens 74 may be configured by combining a plurality of convex lenses and concave lenses, an aspherical lens in which one or both surfaces are not spherical may be used, and any type of lens may be used, as long as it is possible to use as an imaging lens.

The sub-lenses 76a to 76d are arranged on each of the four corners in the visual field of the main lens 74. Four seats 78a to 78d are arranged in the four corners above the main lens 74 facing from the outside to the inside, and the four sub-lenses 76a to 76d are attached to the four seats 78a to 78d. The sub-lenses 76a to 76d are arranged such that the fiducial marks 69a are positioned directly above one of the four sub-lenses 76a to 76d when the component P sucked by the suction nozzle 62 is directly above the center of the main lens 74. Accordingly, since the part camera 70 can use the center of the imaging region 71 of the image sensor 72 in the imaging of the component P and can use the four corners of the imaging region 71 in the imaging of the fiducial marks 69a, it is possible to use the entirety of the imaging region 71 in an effective manner. The sub-lens 76a is set such that the focus height substantially matches the height H2 of the fiducial marks 69a when an object is caused to form an image on the image sensor 72 through the main lens 74 and the sub-lens 76a. Note that, the other sub-lenses 76b to 76d may be set such that the focus height described above differs for each lens, and may be set such that the focus height matches a portion of the lenses or all of the lenses. When a plurality of sub-lenses with different focus heights is arranged, it is possible to support even a pattern in which the combination of the arrangement positions and the arrangement heights of the fiducial marks 69a differs for each of the heads 60 without exchanging the sub-lenses. By providing the main lens 74 which covers the entire range of the imaging region 71 and the sub-lenses 76a to 76d which cover a portion of the imaging region 71, it is possible to image both the component P and the fiducial marks 69a which have different focus heights at the same time in a state in which the component P and the fiducial marks 69a are focused on. Therefore, it becomes possible to shorten the exposure time (the shutter speed), and it becomes possible to perform the imaging (imaging using the so-called on-the-fly system) while the head 60 is moving. As a result, it is possible to shorten the mounting cycle time.

Here, the main lens 74 and the sub-lenses 76a to 76d have lens-specific distortion (pincushion distortion or barrel distortion). Since the sub-lenses 76a to 76d are arranged in the four corners on the main lens 74, combined distortion which differs from the distortion of the main lens 74 alone arises in the four corners of the image which is formed on the image sensor 72 due to the combination of the main lens 74 and the sub-lenses 76a to 76d. When assembly error arises in the sub-lenses 76a to 76d, the combined distortion described above changes further. Therefore, the image is geometrically distorted by greatly differing distortion characteristics in the region (this region is also referred to as a main lens portion) other than the four corners in the imaging region 71 of the image sensor 72 and in the four corner regions (these regions are also referred to as sub-lens portions). Therefore, in the present example, different calibration plates are installed in the main lens portion and the sub-lens portions of the imaging region 71 in advance, and each of the calibration plates is imaged by the part camera 70. The distortion correction values of the lens for each region are measured from each image which is obtained through the imaging, and the measured distortion correction values are stored as a distortion correction table. Accordingly, the images which are obtained by imaging the component P which is sucked by the suction nozzle 62 and the fiducial marks 69a at the same time are corrected using the distortion correction values (the distortion correction table), therefore, it is possible to correct the shifting between the position of the component P in the image and the actual position and the shifting between the position of the fiducial marks 69a and the actual positions caused by the lens distortion.

The mark camera 80 is fixed to the rear of the bottom end of the X-axis slider 52. The imaging range of the mark camera 80 is below the mark camera 80. The mark camera 80 images the board positioning fiducial marks which are provided on the board 16 and outputs the image to the control device 90. The control device 90 recognizes the position of the board 16 by recognizing the center position of the marks based on the image which is captured by the mark camera 80.

As illustrated in FIG. 2, the control device 90 is configured as a microprocessor including the CPU 91, is provided with a ROM 92 which stores process programs, an HDD 93 which stores various data, a RAM 94 which is used as a working region, an input-output interface 95 for performing transactions of electrical signals with an external device, and the like, and these are electrically connected via a bus 96. Image signals from the part camera 70 and the mark camera 80, detection signals from a pressure sensor 82 which detects an internal pressure of the suction nozzle 62, and the like are input to the control device 90 via the input-output interface 95, and, drive signals to the board conveyance device 30, the backup device 40, the X-axis motor 51 of the X-axis slider 52, the Y-axis motor 53 of the Y-axis slider 54, the Z-axis motor 66a of the Z-axis actuator 66, the θ-axis motor 67a of the θ-axis actuator 67, the solenoid valve 86, and the like are output from the control device 90 via the input-output interface 95. The control device 90 is connected to the component supply device 20 to be capable of bidirectional communication. Note that, the X-axis slider 52 and the Y-axis slider 54 are equipped with position sensors which are not depicted in the drawing, and the control device 90 subjects the X-axis motor 51 and the Y-axis motor 53 to drive control while receiving the input of positional information from these position sensors.

As illustrated in FIG. 2, the management computer 100 is configured as a microprocessor including a CPU 101, is provided with a ROM 102 which stores process programs, an HDD 103 which stores production plans of the board 16 and the like, a RAM 104 which is used as a working region, an input-output interface 105 for performing transactions of electrical signals with an external device, and the like, and these are connected via a bus 106. The management computer 100 is capable of receiving input of signals from an input device 112 which is represented by a mouse or a keyboard and is connected to a display 114 to be capable of outputting various images via the input-output interface 105. Here, the production plans of the board 16 refer to plans defining which electronic components to mount on the board 16 in the component mounting machine 10, how many boards 16 (assembled products) having the components mounted thereon to manufacture, and the like. The management computer 100 receives the production plans from a worker via the input device 112, and transmits various commands to the component mounting machine 10 such that the assembled product is manufactured according to the received production plans.

Figure 5:
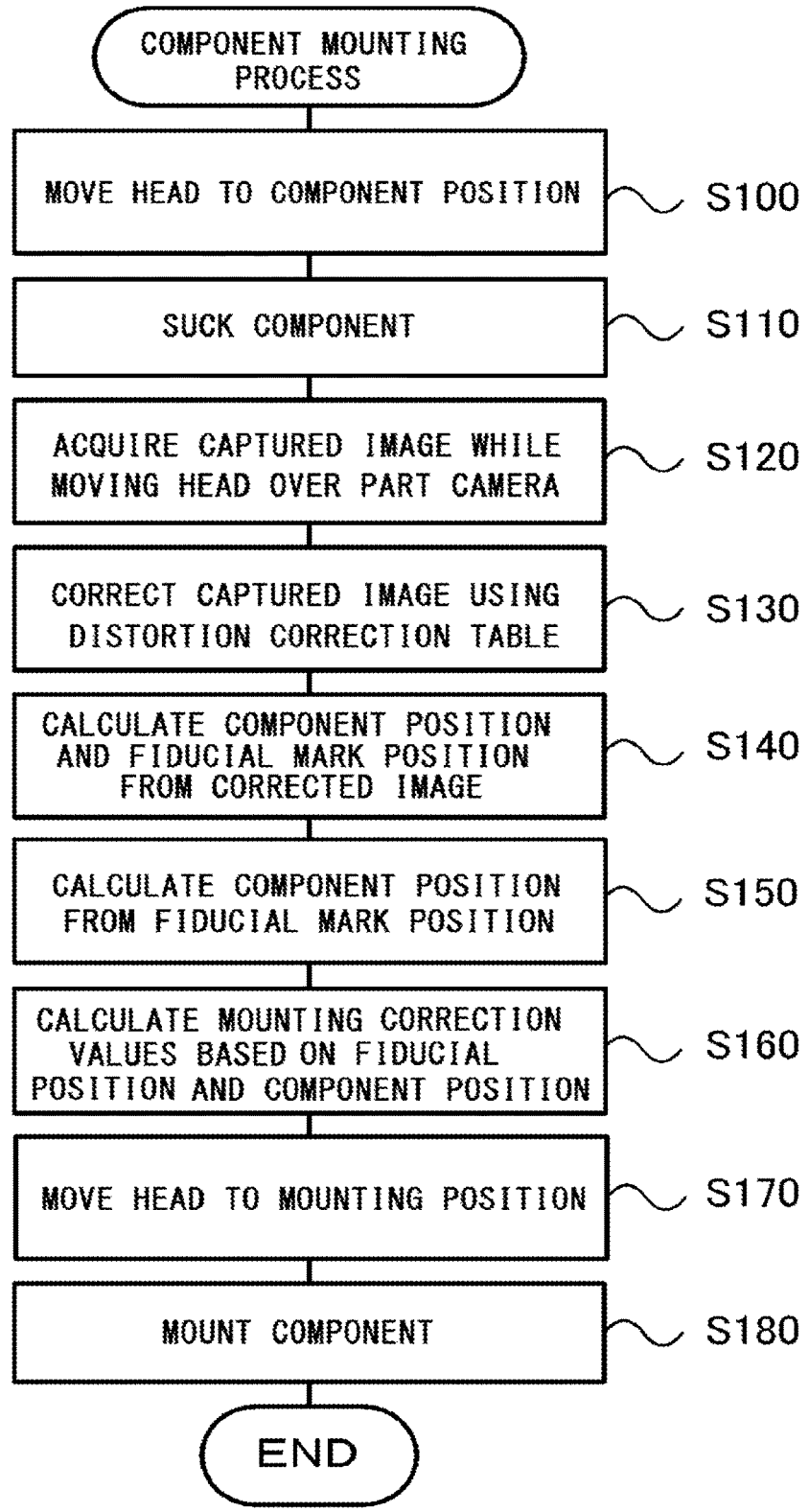
FIG. 5 is a flowchart illustrating an example of a component mounting process which is executed by a CPU 91 of the control device 90.

Next, description will be given of the operations of the component mounting machine 10 of the example which is configured in this manner. FIG. 5 is a flowchart illustrating an example of a component mounting process which is executed by the CPU 91 of the control device 90. The process is executed when the commands from the management computer 100 are received.

When the component mounting process is executed, the CPU 91 of the control device 90 first subjects the X-axis slider 52 (the X-axis motor 51) and the Y-axis slider 54 (the Y-axis motor 53) to drive control such that the suction nozzle 62 moves directly above the component which is supplied by the component supply device 20 (the tape feeder 22) (step S100), and causes the suction nozzle 62 to suck the component by subjecting the Z-axis actuator 66 (the Z-axis motor 66a) to drive control such that the suction nozzle 62 is lowered until the suction nozzle 62 abuts the component and by subjecting the solenoid valve 86 to drive control such that a negative pressure acts on the suction nozzle 62 (step S110). Subsequently, the Z-axis actuator 66 is controlled such that the suction nozzle 62 which sucks the component is lifted, the X-axis slider 52 and the Y-axis slider 54 are controlled such that the suction nozzle 62 moves to above the board 16 while passing over the part camera 70, and a captured image is acquired by performing imaging with the part camera 70 when the suction nozzle 62 is positioned above the part camera 70 (step S120).

When the captured image is acquired, the acquired captured image is corrected using the distortion correction table (step S130). Here, a distortion correction table which is created in advance using a table creation step and is stored in the ROM 92 is used. Hereinafter, detailed description will be given of the table creation step.

Figure 6:
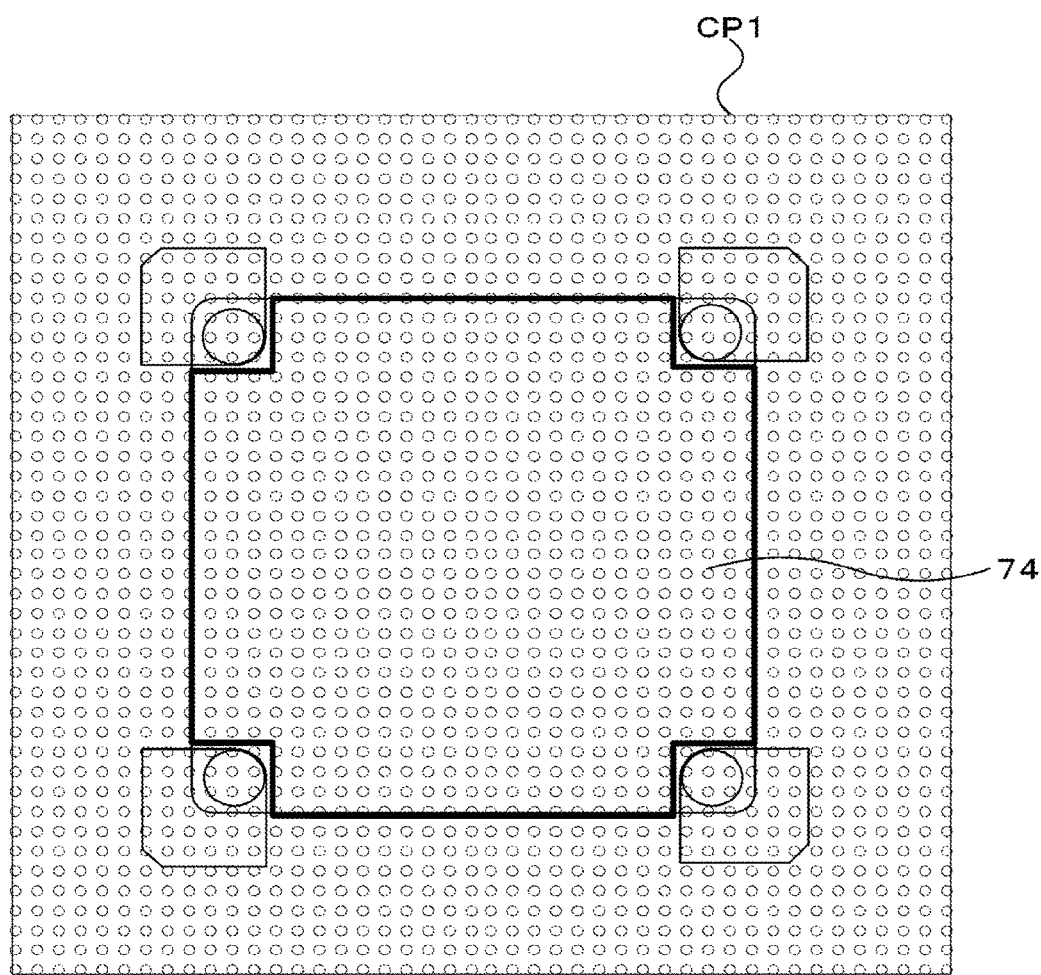
FIG. 6 is a front view of a main lens 74 as viewed through a calibration plate CP1 in a state in which the calibration plate CP1 is installed.
Figure 7:
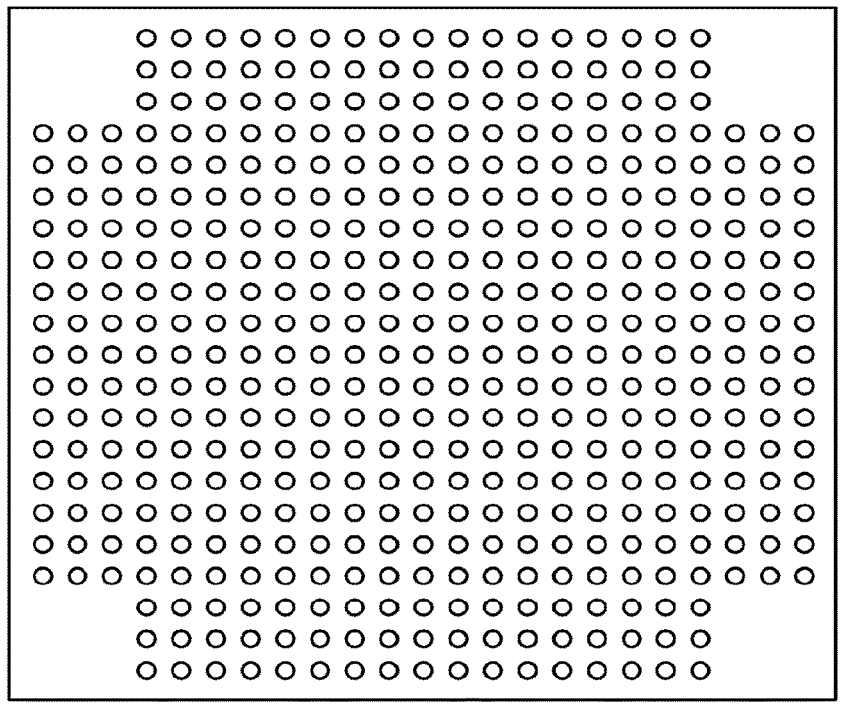
FIG. 7 is an explanatory diagram illustrating a captured image of the calibration plate CP1 which is captured by the part camera 70.

In the table creation step, first, the distortion correction values of the main lens 74 are measured in the region (the main lens portion) excluding the four corners of the imaging region 71 of the image sensor 72. FIG. 6 is a front view of the main lens 74 as viewed through the calibration plate CP1 in a state in which the calibration plate CP1 is installed. In the measurement of the distortion correction values of the main lens portion, the calibration plate CP1 in which circular dots are arranged in a matrix at a predetermined pitch is installed at a height (approximately the same height as the height H1 when the component P which is sucked by the suction nozzle 62 is imaged by the part camera 70) which matches the focus of the main lens 74. Note that, the calibration plate CP1 is not limited to dots being arranged in a matrix, and, for example, any pattern may be used as long as a plurality of feature patterns are caused to line up in rows such as square or rectangular patterns arranged in a checkered pattern. The calibration plate CP1 may be installed by being sucked by the suction nozzle 62, and may be installed using a separate special tool. Next, the installed calibration plate CP1 is imaged by the part camera 70. FIG. 7 illustrates an example of a captured image of the calibration plate CP1 which is captured by the part camera 70. The center position of each dot in the captured image is obtained by analyzing the captured image, and the shift amount between the center position of the dot and the correct center position of the dot which is stored in advance is calculated as the distortion correction value for each dot. Note that, while the distortion correction values are measured in relation to the center positions of the dots in the captured image, it is possible to obtain the distortion correction values of the positions which are distanced from the center positions of the dots from the distortion correction values which are measured in relation to the center positions of the dots of the periphery using a well known interpolation method.

Figure 8:
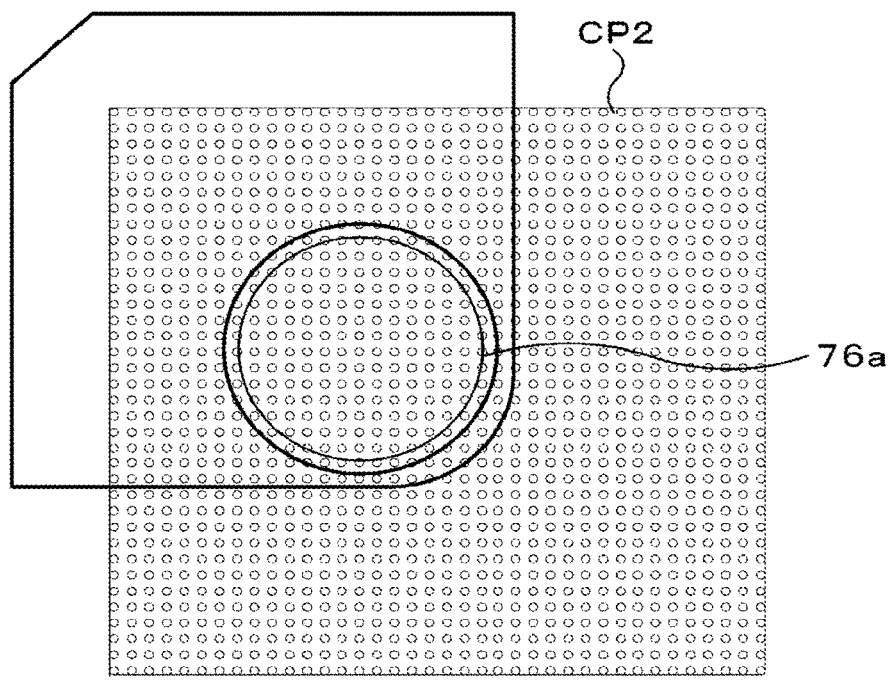
FIG. 8 is a front view of a sub-lens 76a as viewed through a calibration plate CP2 in a state in which the calibration plate CP2 is installed.
Figure 9:
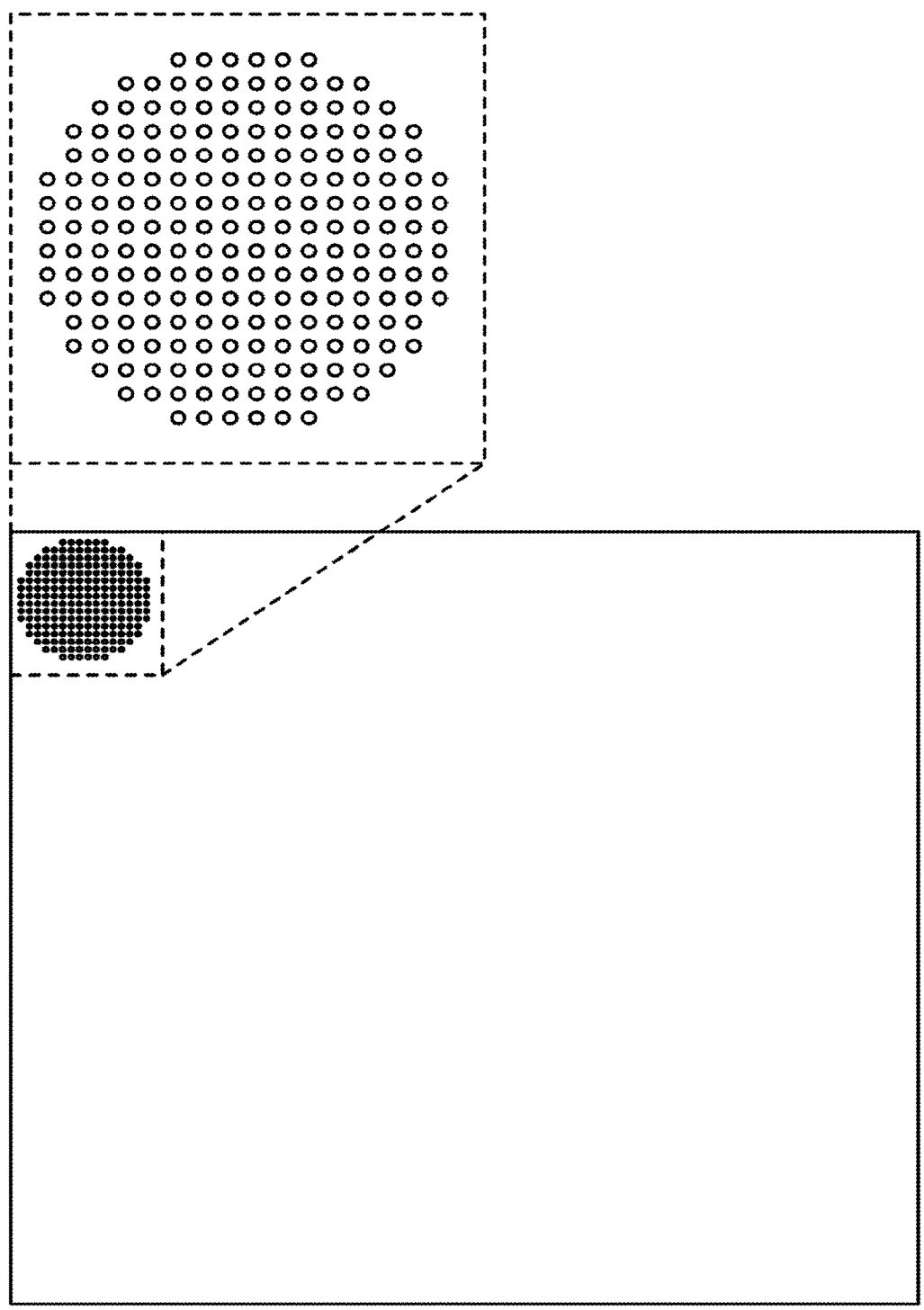
FIG. 9 is an explanatory diagram illustrating a captured image of the calibration plate CP2 which is captured by the part camera 70.

Next, the distortion correction values of the main lens 74 and the sub-lenses 76a to 76d are measured in the regions (the sub-lens portions) of the four corners of the imaging region 71. FIG. 8 is a front view of the sub-lens 76a as viewed through the calibration plate CP2 in a state in which the calibration plate CP2 is installed. In the measurement of the distortion correction values of the sub-lens portion, the calibration plate CP2 in which circular dots are arranged in a matrix at a predetermined pitch is installed at a height (approximately the same height as the height H2 of the fiducial marks 69a) which matches the focus of the main lens 74 and the sub-lens 76a. Here, since the sub-lenses 76a to 76d have lens visual fields which are extremely narrow in comparison to the main lens 74, a calibration plate in which the dots are arranged at a narrower pitch than in the calibration plate CP1 is used for the calibration plate CP2. Note that, the calibration plate CP2 is the same as the calibration plate CP1 in that any pattern may be used as long as a plurality of feature patterns are caused to line up. The calibration plate CP2 may be directly installed on the position reference section 69, and may be installed using a separate special tool. Next, the installed calibration plate CP2 is imaged by the part camera 70. FIG. 9 illustrates an example of a captured image of the calibration plate CP2 which is captured by the part camera 70. The center position of each dot in the captured image is obtained by analyzing the captured image, and the shift amount between the center position of the dot and the correct center position of the dot which is stored in advance is calculated as the distortion correction value for each dot. Note that, while the distortion correction values of the sub-lens portion are measured in relation to the center positions of the dots in the captured image in the same manner as the distortion correction values of the main lens portion, it is possible to obtain the distortion correction values of the positions which are distanced from the center positions of the dots from the distortion correction values which are measured in relation to the center positions of the dots of the periphery using a well known interpolation method. When the distortion correction values of the sub-lens 76a are measured, this step is repeated in the same manner for the remaining sub-lenses 76b to 76d. Note that, in the present example, first, the distortion correction values of the main lens portion are measured, and subsequently, the distortion correction values of the sub-lens portions are measured; however, the distortion correction values of the sub-lens portions may be measured and the distortion correction values of the main lens portion may be subsequently measured.

Figure 10:
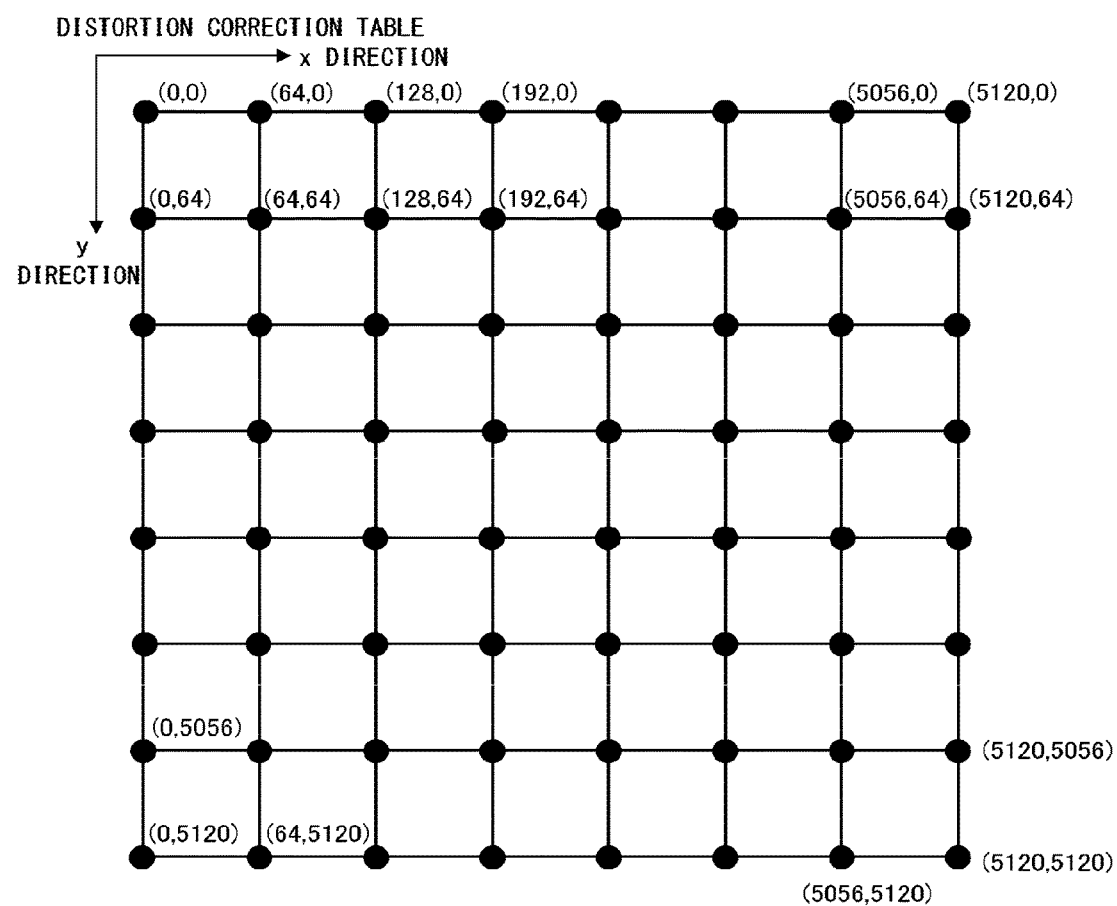
FIG. 10 is an explanatory diagram illustrating an example of a distortion correction table.
Figure 11:
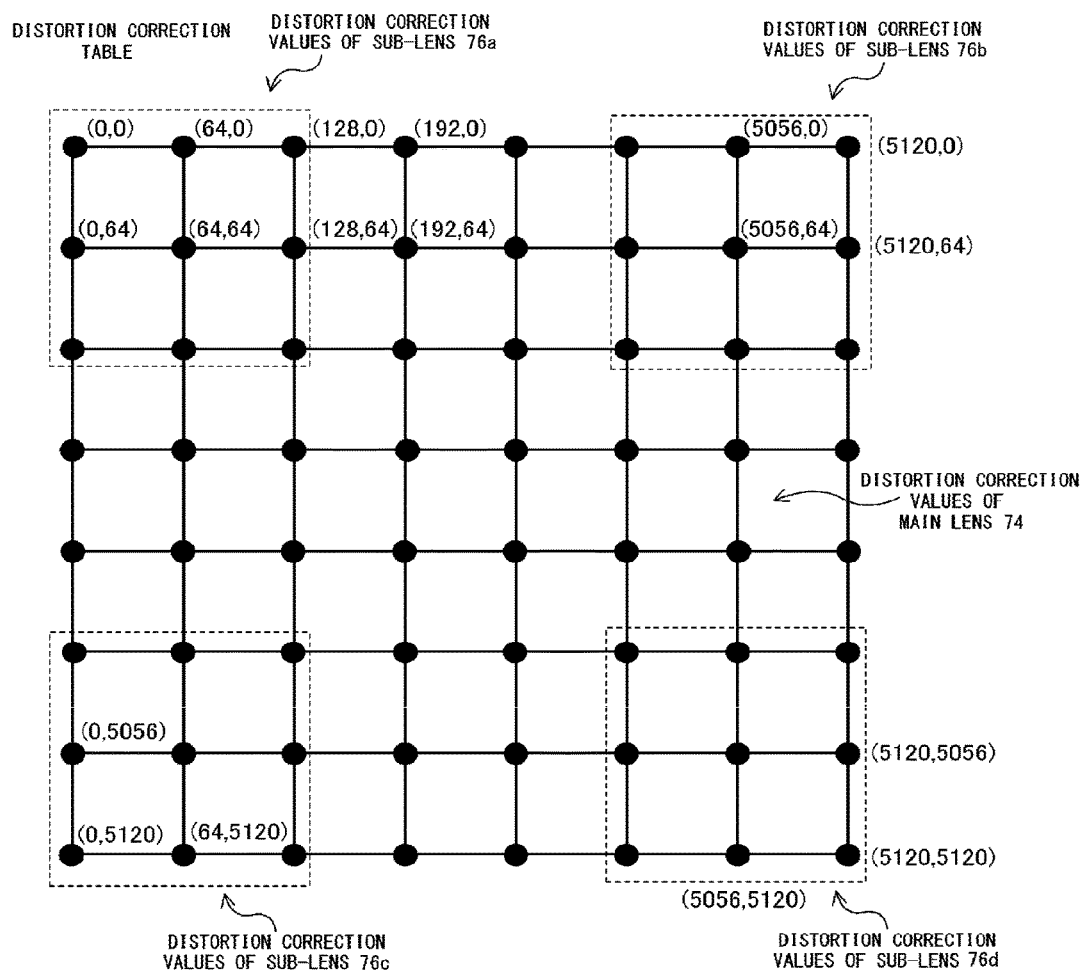
FIG. 11 is an explanatory diagram illustrating an example of distortion correction values for each region of the distortion correction table.

When the distortion correction values of the main lens portion and the distortion correction values of the sub-lens portions are measured in this manner, the distortion correction table is created by associating each of the measured distortion correction values with the coordinate values of the pixels in the corresponding regions. FIG. 10 and FIG. 11 are explanatory diagrams illustrating an example of the distortion correction table. As illustrated in FIG. 10, for pixels which are extracted from 5120×5120 pixels of the image sensor 72 at a 64 pixel pitch in order to reduce the data amount, 81×81 distortion correction values are stored in the distortion correction table in a state of being related to the coordinate values of the corresponding pixels. Each of the distortion correction values contains an X direction distortion correction value and a Y direction distortion correction value. Note that, the distortion correction values are not limited to being stored for pixels which are extracted at a 64 pixel pitch, and, for example, may be stored for pixels which are extracted at another predetermined pixel pitch such as an 8 pixel pitch or a 16 pixel pitch, and the distortion correction values may be stored for all of the pixels in the imaging region 71. As illustrated in FIG. 11, in the main lens portion (the region in which the object is imaged through only the main lens 74 in the imaging region 71), the distortion correction values which are acquired from an image which is obtained by imaging the calibration plate CP1 are stored in the distortion correction table, and in the sub-lens portions (the region in which the object is imaged through the main lens 74 and the sub-lenses 76a to 76d in the imaging region 71), the distortion correction values which are acquired from an image which is obtained by imaging the calibration plate CP2 are stored in the distortion correction table.

Figure 12:
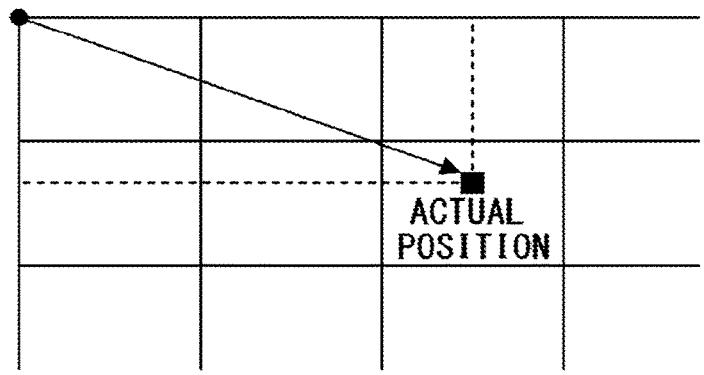
FIG. 12 is an explanatory diagram illustrating a state of distortion correction.
Figure 13:
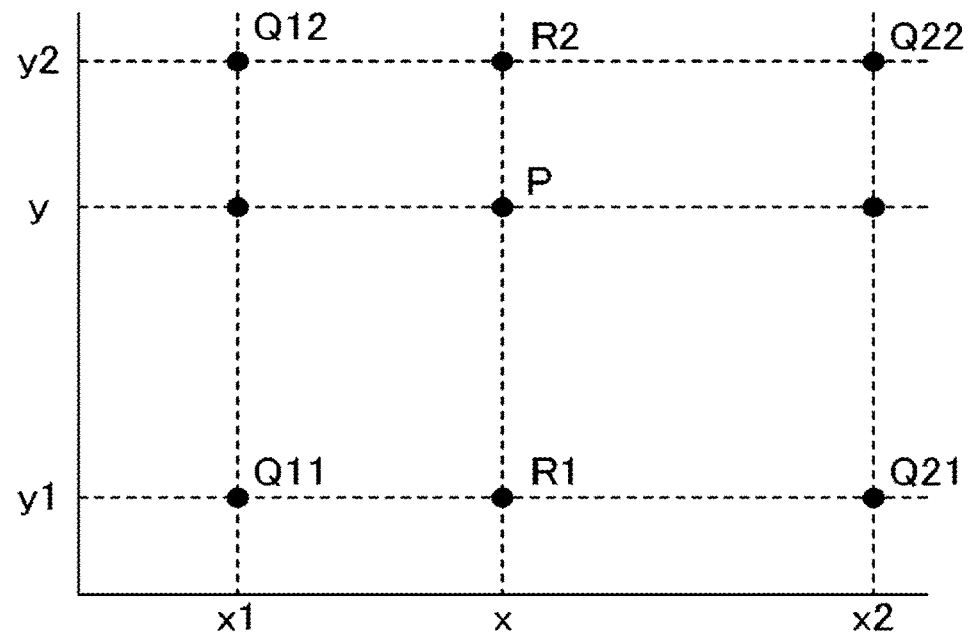
FIG. 13 is a diagram explaining bilinear interpolation.

FIG. 12 is an explanatory diagram illustrating a state of distortion correction. When correcting the image which is captured by the part camera 70 using the distortion correction table, the distortion correction is performed by acquiring the distortion correction values (the X direction distortion correction value and the Y direction distortion correction value) which are associated with the coordinate values of each of the pixels of the captured image from the distortion correction table, treating the acquired distortion correction values as shift amounts of the image, acquiring a brightness value from a pixel of a position (coordinate values) which is shifted in the X direction by the amount of the X direction distortion correction value and is shifted in the Y direction by the amount of the Y direction distortion correction value, and setting the acquired brightness value as the post distortion correction brightness value. As described above, since only the distortion correction values in the pixels which are extracted at a 64 pixel pitch are stored in the distortion correction table, the distortion correction values of the pixels which fill the space therebetween are obtained using interpolation. FIG. 13 is a diagram explaining bilinear interpolation. When interpolating the distortion correction values using bilinear interpolation, for example, as depicted in the drawing, with regard to between the bottom two points (Q11 and Q21) and between the top two points (Q12 and Q22) in the 2×2 pixels (Q11, Q12, Q21, and Q22 in FIG. 13) of the periphery of a coordinate P for which a distortion correction value is to be obtained, an interpolation process (a linear interpolation process) is performed in the X direction, and between the two interpolated points (R1 and R2 in FIG. 13), an interpolation process (a linear interpolation process) is performed in the Y direction. Note that, the interpolation is not limited to the bilinear interpolation, and an appropriate method may be used depending on the part camera 70 which is used or the distortion characteristics of the lens.

Here, in the distortion correction table described above, since the distortion correction values of the main lens portion and the distortion correction values of the sub-lens portions are stored in the same table, the correction of the captured image may be performed simply according to the distortion correction values which are obtained from the distortion correction table without distinguishing between the distortion correction values of the main lens portion and the distortion correction values of the sub-lens portions, and it is possible to increase the speed of the distortion correction process. Since the distortion correction values which are measured based on the images which are obtained by respectively imaging the calibration plates separately for the main lens portion and the sub-lens portions are stored in the distortion correction table, there is no continuity in the distortion correction values on the boundary lines between the main lens portion and the sub-lens portions. Therefore, although it is not possible to perform accurate distortion correction using the distortion correction values on the boundary lines between the main lens portion and the sub-lens portions, since the image distortion is strong and it is not possible to use the outer circumferential portions of the sub-lenses 76a to 76d in the first place, if the object (the fiducial marks 69a) is imaged closer to the inside than the outer circumferential portions of the sub-lenses 76a to 76d, since the distortion correction values of the outer circumferential portions of the sub-lenses 76a to 76d will not be used, no problems arise.

Returning to the component mounting process, when the captured image is corrected using the distortion correction table in this manner, the CPU 91 of the control device 90 calculates the position of the component P (the component position) and the position of the fiducial marks 69a (the fiducial mark position) from the corrected image (step S140), calculates the fiducial position (the movement error of the head 60) from the calculated fiducial mark position (step S150), calculates the positional shift amount and the rotational shift amount of the component in relation to the suction nozzle 62 based on the calculated fiducial position and component position, and sets the mounting correction values such that the positional shift and the rotational shift of the component are cancelled out (step S160). Here, the suction nozzle 62 and the position reference section 69 (the fiducial marks 69a) are both provided on the head 60, and the positional relationship between the X and Y directions does not change. Therefore, the control device 90 can ascertain the position (the fiducial position) of the suction nozzle 62 from the fiducial mark position, and does not require the absolute distance between the fiducial marks and the component when calculating the positional shift and the rotational shift of the component in relation to the suction nozzle 62. Therefore, it is not necessary to render the distortion correction values on the boundaries between the main lens portion and the sub-lens portions of the distortion correction table continuous. Note that, the mark camera 80 may image the board positioning fiducial marks which are provided on the board 16, and the actual correction values may be further adjusted based on the position of the board 16 which is recognized from the captured image. The X-axis slider 52 and the Y-axis slider 54 are subjected to drive control such that the suction nozzle 62 moves to directly above the mounting position of the board 16 (step S170), the component is mounted onto the board 16 by subjecting the Z-axis actuator 66 to drive control such that the suction nozzle 62 is lowered and by subjecting the solenoid valve 86 to drive control such that a positive pressure acts on the suction nozzle 62 (step S180), and the component mounting process is completed. Each component is mounted on the board 16 by repeating the component mounting process in this manner.

According to the component mounting machine 10 of the example which is described above, in a device in which the suction nozzle 62 for sucking the component P and the position reference section 69 (the fiducial marks 69a) are provided on the head 60, the sub-lenses 76a to 76d are installed in the visual field of the main lens 74, and there is provided the part camera 70 which images the component P through the main lens 74 (the main lens portion) and images the fiducial marks 69a through the main lens 74 and the sub-lenses 76a to 76d (the sub-lens portions), the calibration plate CP1 is imaged in the main lens portion of the part camera 70 in advance and the distortion correction values of the main lens portion are measured from the obtained captured image, the calibration plates CP2 are imaged in the sub-lens portions of the part camera 70 and the distortion correction values of the sub-lens portions are measured from the obtained image, and these distortion correction values are stored in advance as a distortion correction table. During the component mounting, when the component P which is sucked by the suction nozzle 62 is positioned above the part camera 70, a captured image which is imaged and obtained by the part camera 70 is corrected using the distortion correction table, and the suction state of the component P by the suction nozzle 62 is determined based on the corrected image. Accordingly, since it is possible to more accurately correct the distortion of the image of the captured image regardless of whether a region is a region which is imaged in the main lens portion or a region which is imaged in the sub-lens portion, it is possible to more accurately recognize the suction state of the component P. It is possible to suppress the occurrence of mounting faults by performing control such that the component P is mounted on the board 16 based on the suction state of the recognized component P.

According to the component mounting machine 10 of the example, since the calibration plates CP2 which are used in the measurement of the distortion correction values of the sub-lens portions are configured using a pattern with a narrow dot (feature) pitch in comparison to the calibration plate CP1 which is used in the measurement of the distortion correction values of the main lens portion, it is possible to measure the distortion correction values of the sub-lenses 76a to 76d which have narrow visual fields with high precision.

In the component mounting machine 10 of the example, the calibration plate CP1 is imaged through the main lens 74 (the main lens portion), the distortion correction values of the main lens portion are measured from the obtained image, the calibration plates CP2 which have a narrower dot (feature) pitch than the calibration plate CP1 are imaged through the main lens 74 and the sub-lenses 76a to 76d (the sub-lens portions), and the distortion correction values of the sub-lens portions are measured from the obtained images. In other words, the distortion correction values are measured using different calibration plates for the main lens portion and the sub-lens portions; however, the configuration is not limited thereto, and the distortion correction values may be measured using the same calibration plate for the main lens portion and the sub-lens portions. In this case, the distortion correction values of the main lens portion and the distortion correction values of the sub-lens portions may be measured using images in which the same calibration plate is imaged at the same time in the main lens portion and the sub-lens portions, respectively. When using the same calibration plate, for example, the distortion correction values of the main lens portion may be measured using the calibration plate CP2 which is appropriate for the measurement of the distortion correction values of the sub-lens portions.

In the component mounting machine 10 of the example, the imaging (imaging using the on-the-fly system) of the component P which is adhered to the suction nozzle 62 while causing the suction nozzle 62 to move over the part camera 70 is performed; however, the configuration is not limited thereto, and the imaging (imaging using a stop-vision system) of the component P which is adhered to the suction nozzle 62 in a state in which the suction nozzle 62 is temporarily stopped over the part camera 70 may be performed.

In the component mounting machine 10 of the example, the four sub-lenses 76a to 76d are arranged in the four corners of the visual field of the main lens 74; however, the configuration is not limited thereto, and the number of sub-lenses to be arranged in the visual field of the main lens 74 may be any number. It is also not necessary for the arrangement positions to be the four corners.

Here, description will be given of the correspondence relationship between the main elements of the example and the main elements of the disclosure described in Solution to Problem field. In the example, the part camera 70 corresponds to "an imaging means", the main lens 74 corresponds to "a first lens", the image sensor 72 corresponds to "an image sensor", the region (the main lens portion) in which the object forms an image on the image sensor 72 through only the main lens 74 corresponds to "a first imaging region", the sub-lenses 76a to 76d correspond to "a second lens", the regions (the sub-lens portions) in which the object forms an image on the image sensor 72 through the lens 76 and the sub-lenses 76a to 76d correspond to "a second imaging region", the head 60 corresponds to "a head", the suction nozzle 62 corresponds to "a holding member", the fiducial marks 69a correspond to "a fiducial mark", and the calibration plate CP1 and the calibration plates CP2 correspond to "a distortion measurement object". The calibration plate CP1 corresponds to "a first distortion measurement object", and the calibration plate CP2 corresponds to "a second distortion measurement object". The X-axis slider 52 and the Y-axis slider 54 correspond to "a movement means", the CPU 91 of the control device 90 which executes the processes of S130 to S160 of the component mounting process of the FIG. 5 corresponds to "a holding state detection means", and the CPU 91 of the control device 90 which executes the processes of S170 and S180 of the component mounting process corresponds to "a mounting control means". Note that, since the example is an example for specifically describing a mode for carrying out the disclosure described in Solution to Problem field, the correspondence relationship between the main elements of the example and the main elements of the disclosure described in Solution to Problem field is not limited to elements of the disclosure described in Solution to Problem field. In other words, the interpretation of the disclosure described in Solution to Problem field should be carried out based on the description of the field itself, and the example is merely a specific example of the disclosure described in Solution to Problem field.

Hereinabove, description is given of a mode for carrying out the present disclosure using the example; however, the present disclosure is not limited in any manner to the example, and, naturally, may be carried out in various modes within a scope that does not depart from the subject matter of the present disclosure.

INDUSTRIAL APPLICABILITY

The present disclosure may be used in the manufacturing industry of component mounting machines, or the like.

REFERENCE SIGNS LIST

10: component mounting machine, 12: housing, 14: base, 16: circuit board, 20: component supply device, 22: tape feeder, 22a: reel, 22b: feeder section, 30: board conveyance device, 32a, 32b: supporting plate, 34a, 34b: conveyor belt, 40: back-up device, 42: back-up plate, 44: base plate, 46: back-up pin, 50: component mounting device, 51: X-axis motor, 52: X-axis slider, 53: Y-axis motor, 54: Y-axis slider, 55, 56: guide rail, 60: head, 62: suction nozzle, 64: nozzle holder, 66: Z-axis actuator, 66a: Z-axis motor, 68: θ-axis actuator, 68a: θ-axis motor, 69: position reference section, 69a: fiducial marks, 70: part camera, 71: imaging region, 72: image sensor, 74: main lens, 76a to 76d: sub-lenses, 78a to 78d: seat, 80: mark camera, 82: pressure sensor, 84: nozzle stocker, 86: solenoid valve, 88: vacuum pump, 89: air pipe, 90: control device, 91: CPU, 92: ROM, 93: HDD, 94: RAM, 95: input-output interface, 96: bus, 100: management computer, 101: CPU, 102: ROM, 103: HDD, 104: RAM, 105: input-output interface, 106: bus, 112: input device, 114 display

The invention claimed is:

1. A component holding state detection method in which a camera is configured to have a first imaging region in which an object forms an image on an image sensor through a first lens and a second imaging region in which an object forms an image on the image sensor through the first lens and a second lens, a component is held using a holding member attached to a head, the component held by the holding member is imaged in the first imaging region and a fiducial mark which is provided on the head is imaged in the second imaging region such that the component and the fiducial marks are imaged at the same time, and a holding state of the component held by the holding member is detected based on an image which is obtained by the imaging, the method comprising:

before determining the holding state, imaging a distortion measurement object in the first imaging region through the first lens, measuring and storing a distortion value of the first imaging region based on an image which is obtained by the imaging, imaging a distortion measurement object in the second imaging region through the first lens and the second lens, the second lens being arranged above the first lens at a corner in a visual field of the first lens, and measuring and storing a distortion value of the second imaging region based on an image which is obtained by the imaging;

when the component is held by the holding member, imaging the component and the fiducial mark by the camera, correcting an image obtained by the imaging of the component in the first imaging region, based on the stored distortion value of the first imaging region, and correcting an image obtained by the imaging of the fiducial mark in the second imaging region, based on the stored distortion value of the second imaging region; and detecting the holding state of the component held by the holding member based on the corrected image.

2. The component holding state detection method according to claim 1, wherein the method includes, before the holding state is determined, installing a first distortion measurement object as the distortion measurement object, imaging the first distortion measurement object in the first imaging region, measuring and storing the distortion value of the first imaging region based on an image which is obtained by the imaging, installing a second distortion measurement object which differs from the first distortion measurement object as the distortion measurement object, imaging the second distortion measurement object in the second imaging region, and measuring and storing the distortion value of the second imaging region based on an image which is obtained through the imaging.

3. The component holding state detection method according to claim 2, wherein the method includes, configuring the first distortion measurement object with a pattern in which a plurality of features are arranged in a matrix, and configuring the second distortion measurement object with a pattern in which a plurality of features are arranged in a matrix at a different pitch from the first distortion measurement object.

4. A component mounting machine which mounts a component on a board, the machine comprising:

a head to which a holding member that holds the component is attached and which is provided with a fiducial mark;

at least one slider for moving the head;

a camera which includes a first imaging region in which an object forms an image on an image sensor through a first lens and a second imaging region in which an object forms an image on the image sensor through the first lens and a second lens and is capable of imaging the component and the fiducial mark at the same time by imaging the component held by the holding member in the first imaging region and imaging the fiducial mark in the second imaging region, the second lens arranged above the first lens at a corner in a visual field of the first lens;

a a control device to correct an image obtained by the imaging in the first imaging region based on a first distortion value measured in advance in relation to the first imaging region, correct an image obtained by the imaging in the second imaging region based on a second distortion value measured in advance in relation to the second imaging region, detect a holding state of the component held by the holding member based on the corrected image, when the component and the fiducial mark are imaged at the same time by the camera, and control the at least one slider and the holding member such that the component is mounted on the board based on the determined holding state of the component.

5. The component mounting machine according to claim 4,
wherein the second lens is a plurality of lenses each one arranged at a corner in the visual field of the first lens.

* * * * *